United States Patent
Lee et al.

(10) Patent No.: US 10,454,518 B2
(45) Date of Patent: Oct. 22, 2019

(54) METHOD FOR REDUCING EMI IN A SYSTEM THAT PERIODICALLY OPERATES WITH A FIXED SAMPLING FREQUENCY AND RECORDING MEDIUM AND DEVICE FOR PERFORMING THE SAME

(71) Applicant: Foundation of Soongsil University-Industry Cooperation, Seoul (KR)

(72) Inventors: Seongsoo Lee, Seoul (KR); Youngsan Shin, Seoul (KR)

(73) Assignee: FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 0 days.

(21) Appl. No.: 15/752,562

(22) PCT Filed: Oct. 18, 2016

(86) PCT No.: PCT/KR2016/011663
§ 371 (c)(1),
(2) Date: Feb. 13, 2018

(87) PCT Pub. No.: WO2018/070575
PCT Pub. Date: Apr. 19, 2018

(65) Prior Publication Data
US 2019/0044570 A1    Feb. 7, 2019

(30) Foreign Application Priority Data
Oct. 14, 2016 (KR) .................. 10-2016-0133631

(51) Int. Cl.
*H04B 1/69* (2011.01)
*H04B 15/00* (2006.01)
(Continued)

(52) U.S. Cl.
CPC .............. *H04B 1/69* (2013.01); *H03M 1/12* (2013.01); *H04B 1/7105* (2013.01); *H04B 15/00* (2013.01); *H04L 25/03* (2013.01)

(58) Field of Classification Search
CPC ................................ H04B 1/69; H04B 15/00
See application file for complete search history.

(56) References Cited

U.S. PATENT DOCUMENTS 8,135,103 B1 * 3/2012 Courcy .................. H03L 7/197
                                                 348/537
8,320,428 B1   11/2012 Hattori
(Continued)

FOREIGN PATENT DOCUMENTS

JP      2008-021194 A    1/2008
KR      10-0399799 B1   12/2003
(Continued)

*Primary Examiner* — Dac V Ha
(74) *Attorney, Agent, or Firm* — Novick, Kim & Lee, PLLC; Sang Ho Lee (57) ABSTRACT

A method for reducing electromagnetic interference (EMI) in a system that periodically operates with a fixed sampling frequency includes reading a digital signal to which an analog signal received from a sensor is converted, generating a time delay that is modulated each cycle of the fixed sampling frequency with software, starting to execute a digital signal processing algorithm by applying the time delay that is modulated, and transmitting to another device through write of the digital signal. Accordingly, the EMI spectrum is spread through the time delay that is modulated with software, resulting in reduced EMI level.

17 Claims, 10 Drawing Sheets

(51) Int. Cl.
*H03M 1/12* (2006.01)
*H04B 1/7105* (2011.01)
*H04L 25/03* (2006.01)

(56) References Cited

U.S. PATENT DOCUMENTS

2007/0019711 A1 1/2007 Mallinson et al.
2017/0150241 A1* 5/2017 Collin .................. H04Q 9/14
2018/0356936 A1* 12/2018 Shepelev ............. G06F 3/044

FOREIGN PATENT DOCUMENTS

| KR | 10-2005-0008880 A | 1/2005 |
| KR | 10-2010-0077741 A | 7/2010 |
| KR | 10-2011-0076262 A | 7/2011 |

* cited by examiner

FIG. 1

PRIOR ART

```
Loop(){
    ........
    DELAY_US(Td_mod);
    ........
    Main Digital Signal Processing Algorithm
    ........
    if( direction == 0 ){
            Td_mod += Td_step1;
            Td_step1 += Td_step2;
            if( Td_mod == Td_limit ){
                    direction = 1;
                    Td_step1 = Td_step2;
            }
    } else {
            Td_mod -= Td_step1;
            Td_step1 += Td_step2;
            if( Td_mod == 0 ){
                    direction = 0;
                    Td_step1 = Td_step2;
            }
    }
    ........
}
```

```
Memory() {
Td_mod[0]=0;
Td_mod[1]=1;
Td_mod[2]=3;
Td_mod[3]=6;
.......
Td_mod[14]=3;
Td_mod[15]=1;
Td_mod[16]=0;
}

Loop(){
........
DELAY_US(Td_mod[n]);
........
Main Digital Signal Processing Algorithm
........
n=n+1;
If(n==17){n=0;}
........
}
```

FIG. 14

# METHOD FOR REDUCING EMI IN A SYSTEM THAT PERIODICALLY OPERATES WITH A FIXED SAMPLING FREQUENCY AND RECORDING MEDIUM AND DEVICE FOR PERFORMING THE SAME

TECHNICAL FIELD

The present disclosure relates to a method for reducing electromagnetic interference (EMI) in a system that periodically operates with a fixed sampling frequency and a recording medium and a device for performing the same, and more particularly, to a method for reducing EMI in a system that periodically operates with a fixed sampling frequency by adding a time delay that is modulated each cycle with software, and a recording medium and a device for performing the same.

BACKGROUND ART

In the case of automotive and medical semiconductors requiring high reliability, there are limits to the EMI level. A typical method used to reduce EMI is to apply a Spread Spectrum Clock Generator (SSCG). However, this system operation involves reading a signal from a sensor and digital signal processing, and because the operation should conform to a fixed sampling frequency, it is not easy to apply SSCG, and furthermore due to current consumption cycles in the sampling frequency, EMI of the corresponding frequency occurs.

The conventional art modulates the sampling frequency in a predefined pattern (Spread Spectrum Sampling), and changes a sampled signal to a signal of the modulated sampling frequency through a complex algorithm.

To modify a signal, a complex operation (e.g., division) is needed. Additionally, additional hardware (SSCG) that modulates the clock in a preset pattern is necessary. Further, since the clock modulation method is hardware implementation, flexibility is low when it is necessary to vary the amount of modulation based on the sampling period.

Figure 1:
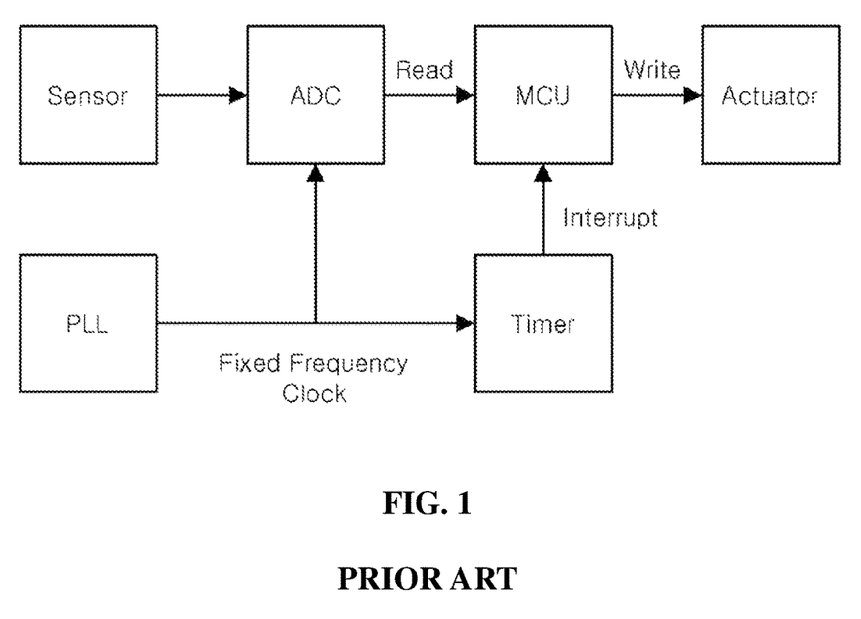
FIG. 1 is a block diagram of a general sensor system according to the related art.

FIG. 1 is a block diagram of a general sensor system according to the related art. An analog signal from a sensor is converted to a digital signal through the ADC, and a digital signal processing algorithm runs on the MCU. The signal-processed digital signal is transmitted to an actuator or other chip depending on the field of application.

In this instance, because periodicity of read & write is very important, phase-locked loop (PLL) clock output of a fixed frequency generates periodic interrupts in the timer circuit. The MCU performs read, DSP, and write in a sequential order with respect to the interrupts.

In this instance, because the entire system periodically consumes an electric current due to interrupt generation, there is a problem of EMI noise occurring in the corresponding cycle.

DISCLOSURE

Technical Problem

Therefore, the present disclosure is designed to address this issue, and the present disclosure is directed to providing a method for reducing the electromagnetic interference (EMI) in a system that periodically operates with a fixed sampling frequency.

The present disclosure is further directed to providing a recording medium having recorded thereon a computer program for performing the method for reducing EMI in a system that periodically operates with a fixed sampling frequency.

The present disclosure is further directed to providing a device for performing the method for reducing EMI in a system that periodically operates with a fixed sampling frequency.

Technical Solution

To achieve the object of the present disclosure described above, a method for reducing the electromagnetic interference (EMI) in a system that periodically operates with a fixed sampling frequency according to an embodiment includes reading a digital signal to which an analog signal received from a sensor is converted, generating a time delay that is modulated each cycle of the fixed sampling frequency with software, starting to execute a digital signal processing algorithm by applying the time delay that is modulated, and transmitting to another device through write of the digital signal.

In an embodiment of the present disclosure, the generating of a time delay that is modulated each cycle of the fixed sampling frequency with software may include selecting a time delay from a modulation profile pre-stored in a memory each cycle.

In an embodiment of the present disclosure, the pre-stored modulation profile may be sequentially selected.

In an embodiment of the present disclosure, the pre-stored modulation profile may be randomly selected.

In an embodiment of the present disclosure, the generating of a time delay that is modulated each cycle of the fixed sampling frequency with software may include calculating a time delay by computation in each cycle.

In an embodiment of the present disclosure, the generating of a time delay that is modulated in each cycle of the fixed sampling frequency with software may include applying at least one modulation method of sawtooth wave modulation, triangular modulation, Hershey-Kiss modulation, Sigma delta modulation and random variable generation.

To achieve another object of the present disclosure, a computer-readable recording medium according to an embodiment has recorded thereon a computer program for performing a method for reducing EMI in a system that is operating periodically with a fixed sampling frequency To achieve still another object of the present disclosure, a device for reducing EMI in a system that periodically operates with a fixed sampling frequency according to an embodiment includes a read unit which reads a digital signal to which an analog signal received from a sensor is converted, a time delay generation unit which generates a time delay that is modulated each cycle of the fixed sampling frequency with software, an algorithm execution unit which starts to execute a digital signal processing algorithm by applying the time delay that is modulated, and a transmission unit which transmits to another device through write of the digital signal.

In an embodiment of the present disclosure, the time delay generation unit may select a time delay from a modulation profile pre-stored in a memory each cycle.

In an embodiment of the present disclosure, the pre-stored modulation profile may be selected sequentially or randomly.

In an embodiment of the present disclosure, the time delay generation unit may calculate a time delay by computation in each cycle.

In an embodiment of the present disclosure, the time delay generation unit may apply at least one modulation method of sawtooth wave modulation, triangular modulation, Hershey-Kiss modulation, Sigma delta modulation and random variable generation.

Advantageous Effects

According to the method for reducing electromagnetic interference (EMI), in sensor systems that carry out periodic sampling for use in the field with EMI level limits, the EMI level may be greatly reduced by spreading the EMI spectrum through a time delay whereby the point in time of computation in the Micom is modulated with software. Additionally, there is no need for a complex algorithm or additional hardware, thereby reducing the system cost.

DETAILED DESCRIPTION OF MAIN ELEMENTS

10: Device for reducing EMI
110: Read unit
130: Time delay generation unit
150: Algorithm execution unit
170: Transmission unit

BEST MODE

The present disclosure is described in detail as below with reference to the accompanying drawings in which particular embodiments for carrying out the present disclosure are shown for illustration. These embodiments are described in sufficient detail to enable those skilled in the art to practice the present disclosure. It should be understood that various embodiments of the present disclosure are different from each other, but they do not need to be exclusive. For example, a particular shape, structure and characteristic described herein, in connection with one embodiment, may be implemented in other embodiments without departing from the spirit and scope of the present disclosure. It should be further understood that modification may be made to the position or arrangement of respective elements in each disclosed embodiment without departing from the spirit and scope of the present disclosure. Therefore, the following detailed description is not intended to make in a limitative sense, and the scope of the present disclosure is only defined by the appended claims, if appropriately described, along with the full scope of equivalents to which the claims are entitled. In the drawings, similar reference numerals denote same or similar functions throughout many aspects.

Hereinafter, the preferred embodiments of the present disclosure will be described in more detail with reference to the accompanying drawings.

Figure 2:
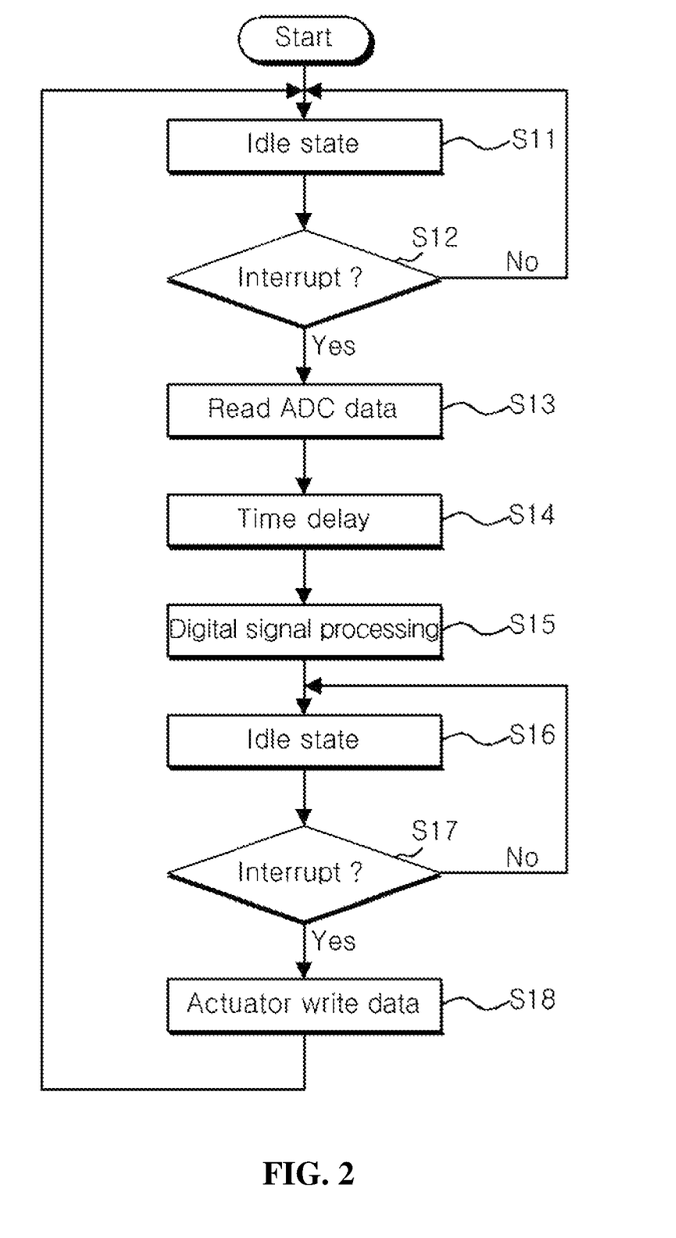
FIG. 2 is a flowchart of a method for reducing electromagnetic interference (EMI) in a system that periodically operates with a fixed sampling frequency according to the present disclosure.
Figure 3:
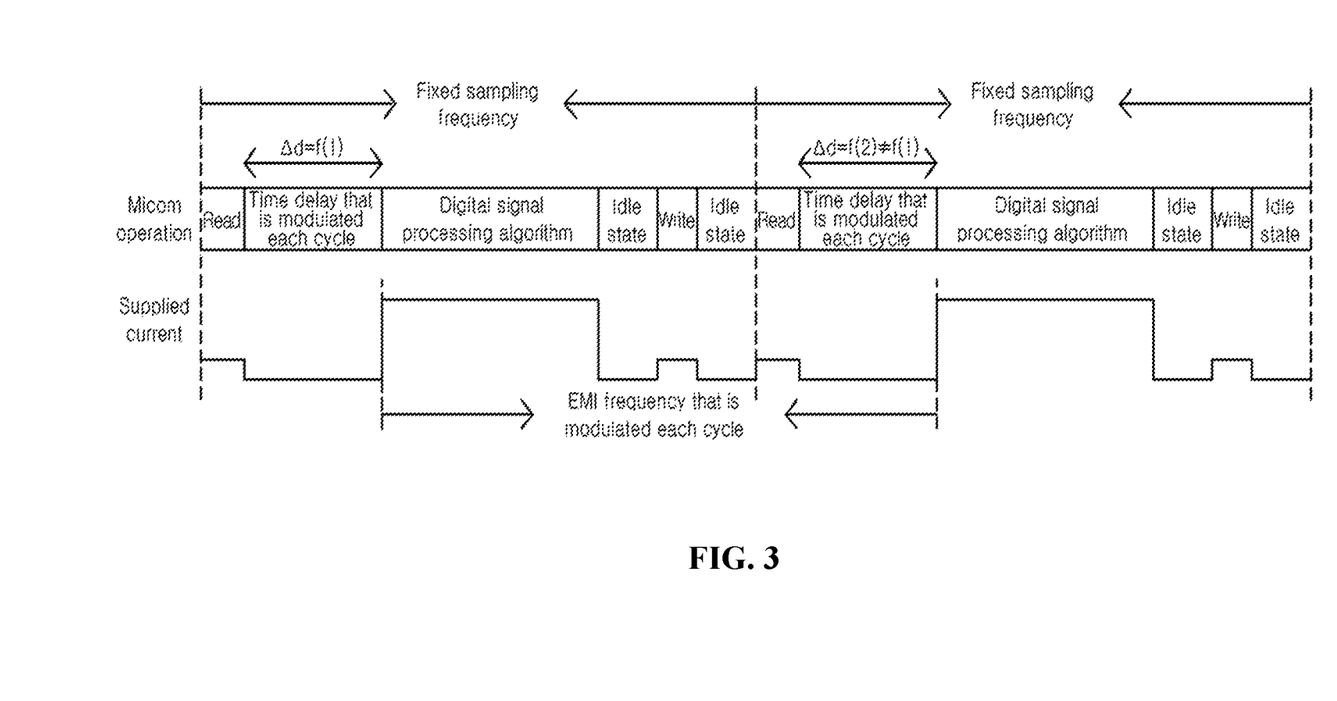
FIG. 3 is a timing diagram of FIG. 2.

FIG. 2 is a flowchart of a method for reducing electromagnetic interference (EMI) in a system that periodically operates with a fixed sampling frequency according to the present disclosure. FIG. 3 is a timing diagram of FIG. 2.

The method for reducing EMI according to the present disclosure is that in a system that operates periodically, the software in the Micom reads the signal from the ADC and modulates the time until the digital signal processing is performed through software delay, thereby reducing EMI by distributing the EMI generation at a specific frequency.

For example, the method for reducing EMI may be performed in a micro controller unit (MCU) of a smart car, and also may be performed in automotive, medical and mobile devices.

Meanwhile, the method for reducing EMI according to this embodiment may be performed by software (application) for reducing EMI in a system that periodically operates with a fixed sampling frequency.

Referring to FIG. 2, the method for reducing EMI in a system that periodically operates with a fixed sampling frequency according to this embodiment includes, when it is in an idle state (S11), in the event of an interrupt (S12), reading a digital signal to which an analog signal received from a sensor is converted (S13).

The analog signal received from the sensor may be an audio signal, a video signal, a touch signal, a detection signal, an acceleration signal and an optical signal, but is not limited thereto, and may include all signals received from the sensor.

After the digital signal is read (S13), a time delay that is modulated each cycle of a fixed sampling frequency is generated with software (S14).

That is, between the time that the Micom reads the ADC's data and starts to compute the digital signal processing algorithm, it adds software time delay that is modulated every cycle.

Accordingly, although the sampling frequency is fixed, the time of an electric current supplied for digital signal processing algorithm computation is changed as much as the time delay that is modulated each cycle (see FIG. 3). Thus, the EMI frequency is also modulated each cycle with the current change, so the EMI spectrum has a shape that it is spread over many frequencies.

In this instance, the time delay that is modulated each cycle may be obtained by computation with a software algorithm each time, and may be obtained by retrieval of a preset modulation profile stored in the memory.

In an embodiment, the time delay may be selected from the modulation profile pre-stored in the memory each cycle. The pre-stored modulation profile may be selected sequentially or randomly.

The profile stored in the memory may use sawtooth wave modulation, triangular modulation, Hershey-Kiss modulation and Sigma delta modulation, and the modulation method is not limited thereto and various modulation methods may be applied.

In another embodiment, the time delay that is calculated by computation and modulated each cycle may be selected. In this case, different modulation computation functions may be applied each cycle.

The execution of a digital signal processing algorithm starts by applying the time delay that is modulated to process the digital signal (S15). Subsequently, when it is in an idle state (S16), in the event of an interrupt (S17), the processed signal is transmitted to another device such as an actuator or other chip through write of the digital signal (S18).

Accordingly, the time of an electric current supplied for digital signal processing algorithm computation is changed as much as the time delay that is modulated each cycle, and as a consequence, the EMI frequency is also modulated each cycle with the current change. Thus, the EMI spectrum is spread, resulting in reduced EMI.

FIGS. 4 to 8 are an embodiment of the present disclosure, showing an example in which the time delay algorithm that is modulated by sawtooth wave modulation is added prior to a main digital signal processing algorithm.

Figure 4:
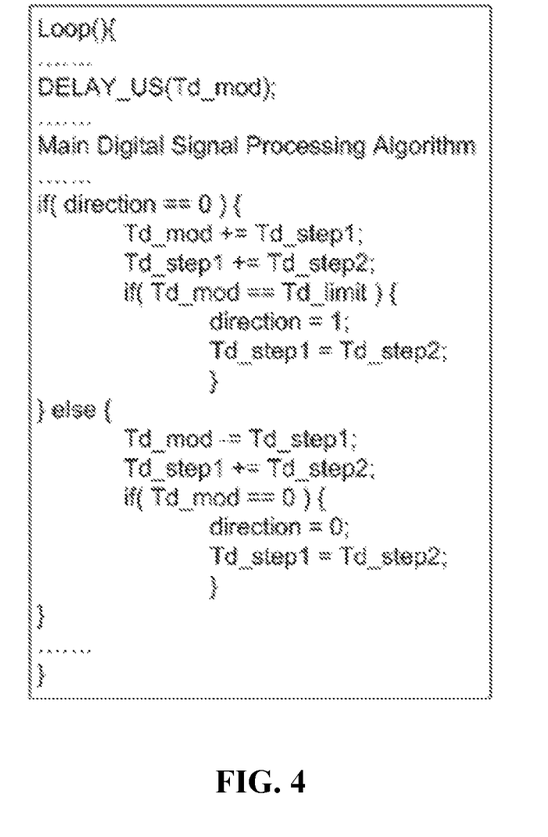
FIG. 4 is an illustration of a time delay algorithm that is modulated in each cycle according to an embodiment of the present disclosure.
Figure 5:
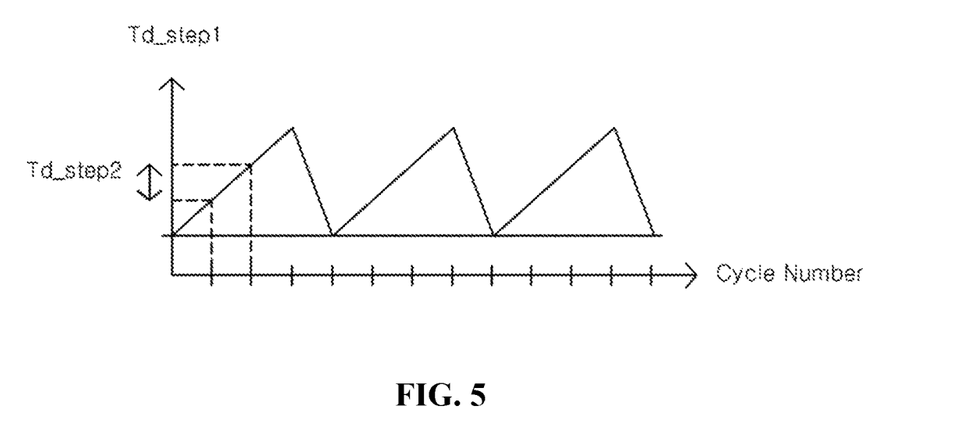
FIG. 5 is a graph showing Td_step1 changes in each cycle according to the algorithm of FIG. 4.

FIG. 4 is an illustration of the time delay algorithm that is modulated each cycle according to an embodiment of the present disclosure, and FIG. 5 is a graph showing Td_step1 changes in each cycle according to the algorithm of FIG. 4.

Here, as the sawtooth wave profile of FIG. 5 is applied, different time delays may be created each cycle. This is represented as an algorithm in FIG. 4.

Figure 6:
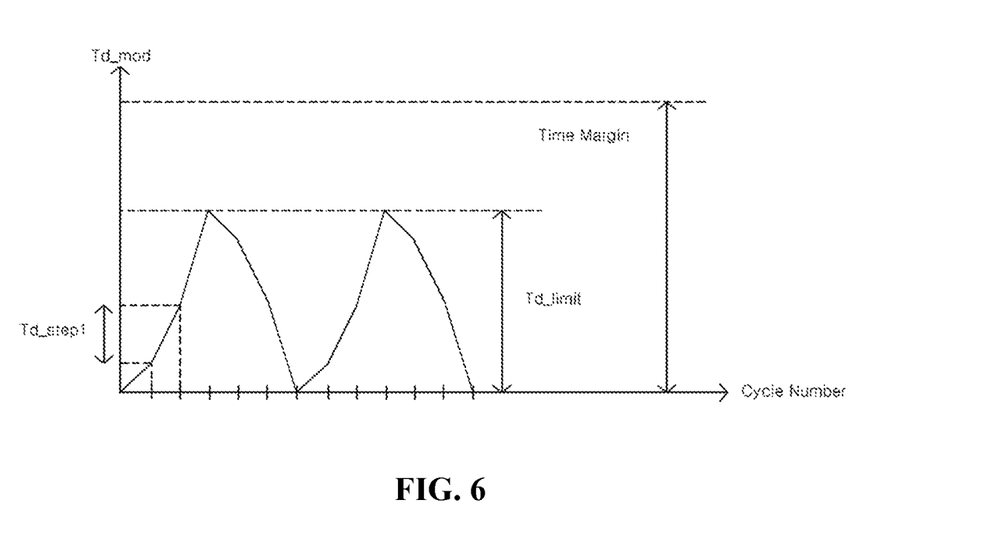
FIG. 6 is a graph showing Td_var changes in each cycle according to the algorithm of FIG. 4.
Figure 7:
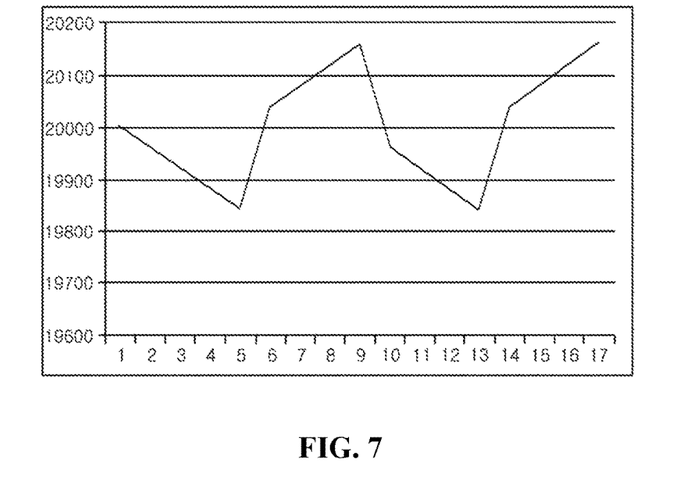
FIG. 7 is a graph showing frequency modulation according to the algorithm of FIG. 4.

FIG. 6 shows Td_var changes in each cycle according to the algorithm of FIG. 4, and FIG. 7 shows frequency modulation according to the algorithm of FIG. 4. As can be seen from FIG. 7, an effect that the frequency is modulated each cycle is brought about.

Figure 8:
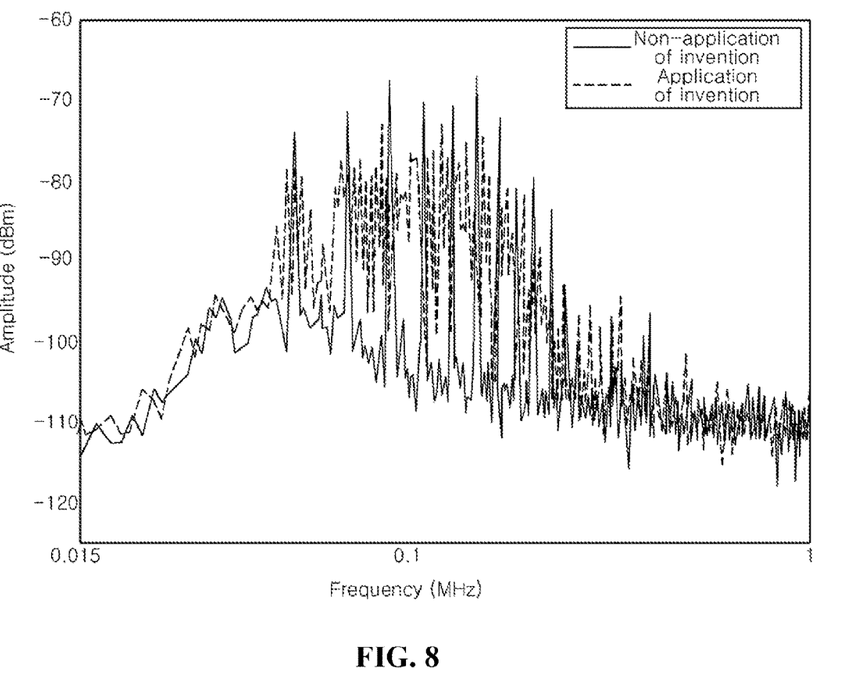
FIG. 8 is a graph showing the EMI level measurement results when implementation of FIG. 4 is actually applied and is not applied.

FIG. 8 is a graph showing the EMI level measurement results when implementation of FIG. 4 is actually applied and when it is not applied.

Referring to FIG. 8, in comparison of application and non-application of the method for reducing EMI proposed by the present disclosure to a test product, it can be seen that the EMI level is reduced by about −6 dB. In this instance, a reduced value is dependent on each parameter of the algorithm. Accordingly, EMI reduction may be controlled by adjusting the algorithm parameters.

The following table 1 shows EMI reduction effects as a function of the condition (modulation depth) of the time delay modulation algorithm. The condition (modulation depth) of various time delay modulation algorithms may be selected based on the required EMI level or the remaining time, and because it is based on software, it is possible to flexibly respond.

TABLE 1

| | Maximum (50 k to 1 MHz) | Reduction Power | Maximum (150 k to 1 MHz) | Reduction Power | Unit |
|---|---|---|---|---|---|
| Default Modulation Depth (%) | −67.22 | | −70.94 | | dBm |
| 1.2 | −72.78 | 5.56 | −77.99 | 7.05 | dBm |
| 2 | −73.39 | 6.17 | −78.28 | 7.34 | dBm |
| 3 | −73.36 | 6.14 | −80.27 | 9.33 | dBm |
| 4.2 | −73.71 | 6.49 | −79.78 | 8.84 | dBm |

FIGS. 9 to 12 show another embodiment of the present disclosure, using the time delay that is modulated by triangular modulation based on the memory.

Figure 9:
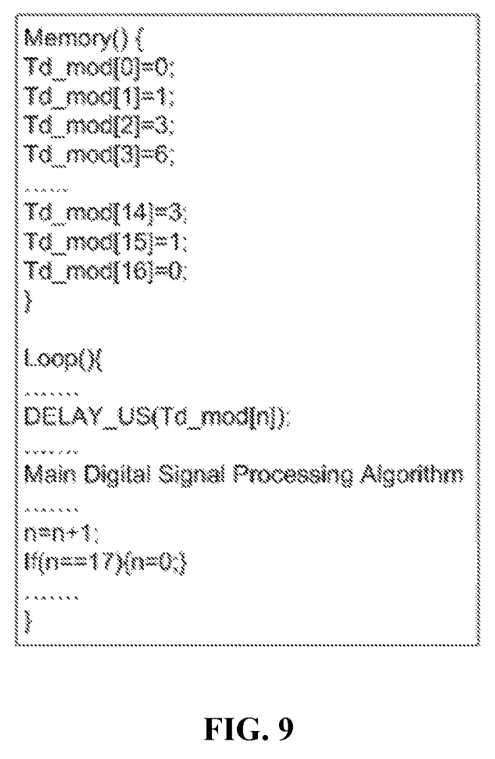
FIG. 9 is an illustration of time delay modulated each cycle using a memory according to another embodiment of the present disclosure.
Figure 10:
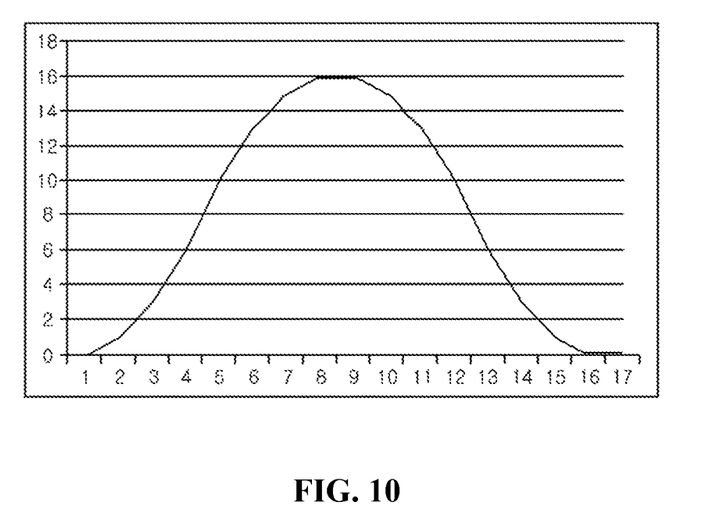
FIG. 10 is an example of time delay values stored in the memory of FIG. 9.
Figure 11:
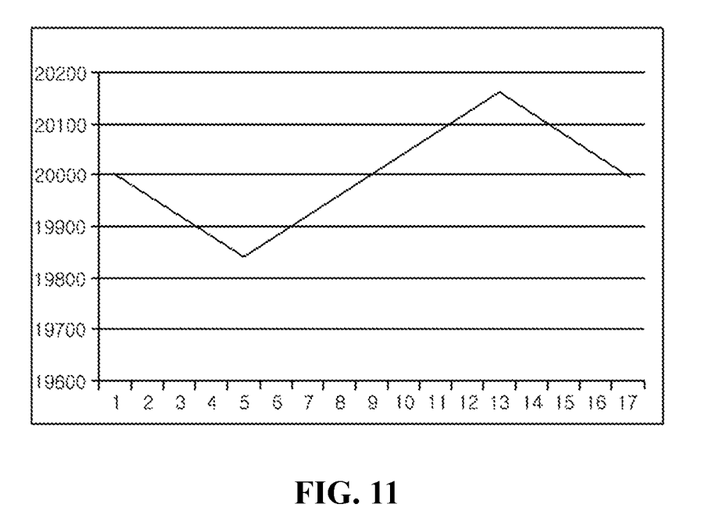
FIG. 11 is an example of time delay values stored in the memory of FIG. 9.

FIG. 9 is an illustration the time delay that is modulated each cycle using the memory according to another embodiment of the present disclosure, and each of FIGS. 10 and 11 are examples of time delay values stored in the memory of FIG. 9. Referring to FIG. 9, a time delay value of 1 in a first cycle, a time delay value of 3 in a second cycle, and a time delay value of 6 in a third cycle are given. As described above, time delays may be sequentially selected each cycle, and as shown in FIGS. 10 and 11, time delay values stored in the memory may be used.

Figure 12:
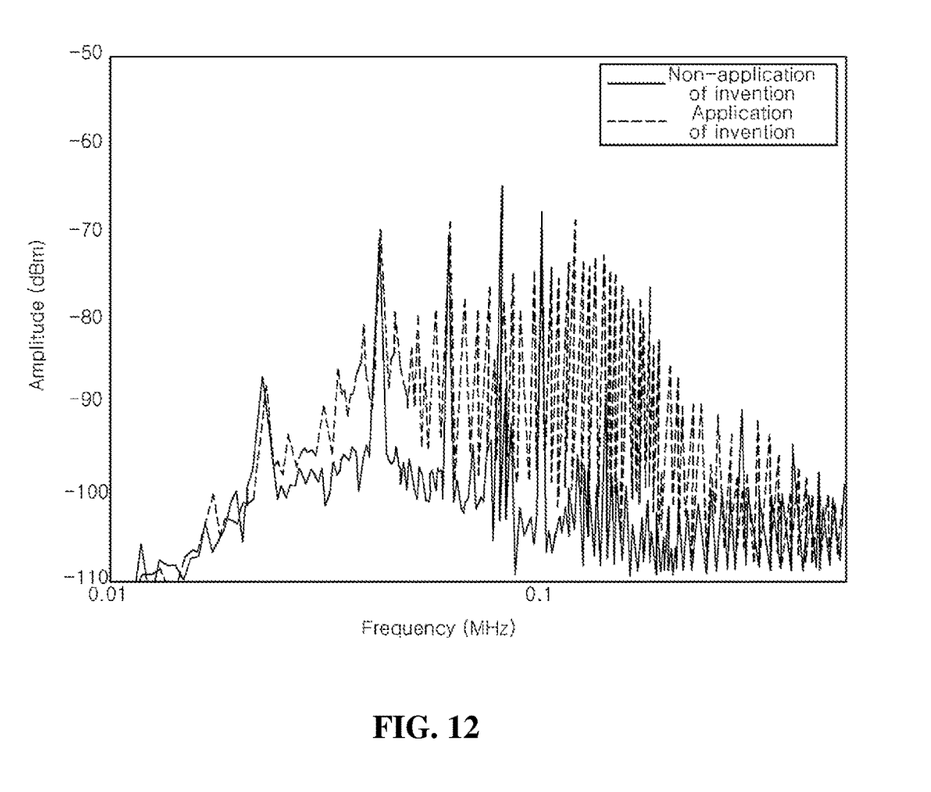
FIG. 12 is a graph showing the EMI level measurement results when implementation of FIG. 9 is actually applied, and when it is not applied.

FIG. 12 is a graph showing the EMI level measurement results when implementation of FIG. 9 is actually applied and is not applied.

Referring to FIG. 12, in comparison of application and non-application of the method for reducing EMI proposed by the present disclosure to a test product, it can be seen that the EMI level is reduced by about −4 dB in the range above 150 kHz limited in Cispr25 standard. In this instance, a reduced value is dependent on each parameter of the algorithm. Accordingly, EMI reduction may be controlled by adjusting the algorithm parameters.

Figure 13:
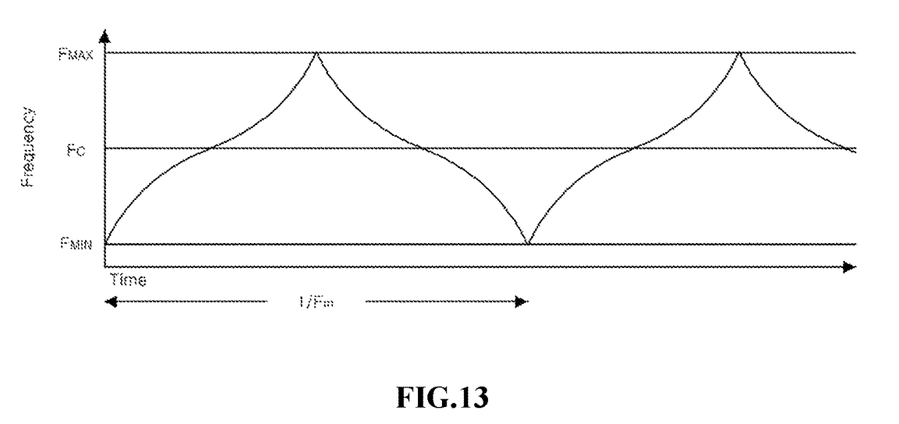
FIG. 13 is a graph showing the Hershey-Kiss modulation profile according to still another embodiment of the present disclosure.

FIG. 13 is a graph showing the Hershey-Kiss modulation profile according to still another embodiment of the present disclosure.

Referring to FIG. 13, the time delay is modulated using Hershey-Kiss modulation. However, the modulation method is not limited thereto, and various methods may be applied, including sawtooth wave modulation, triangular modulation, Sigma delta modulation and a random variable generation method.

In sensor systems that carry out periodic sampling for use in the field with EMI level limits, the present disclosure may reduce the EMI level without additional hardware (i.e., low cost) by giving a software time delay to the time at which the operation of the algorithm consumed by the current consuming in the Micom starts.

The method for reducing EMI in a system that periodically operates with a fixed sampling frequency as described above may be implemented as an application or in the form of program commands that are executed through various computer components and may be recorded in computer-readable recording media. The computer-readable recording media may include program commands, data files and data structures, alone or in combination.

The program commands recorded in the computer-readable recording media may be specially designed and configured for the present disclosure, and may be those known and available to those having ordinary skill in the field of computer software.

Examples of the computer-readable recording media include hardware devices specially designed to store and execute program commands, for example, magnetic media such as hard disk, floppy disk and magnetic tape, optical media such as CD-ROM and DVD, magneto-optical media such as floptical disk, and ROM, RAM, and flash memory.

Examples of the program command include machine code generated by a compiler as well as high-level language code that can be executed by a computer using an interpreter. The hardware device may be configured to act as one or more software modules to perform the operation according to the present disclosure, or vice versa.

Figure 14:
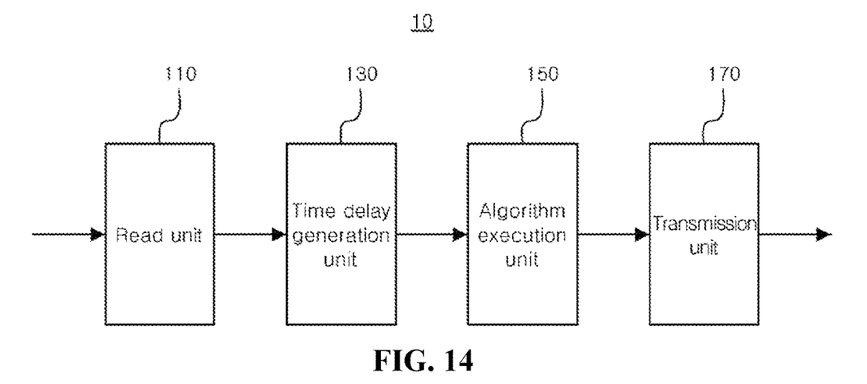
FIG. 14 is a block diagram of a device for reducing EMI in a system that periodically operates with a fixed sampling frequency according to the present disclosure.

FIG. 14 is a block diagram of a device for reducing EMI in a system that periodically operates with a fixed sampling frequency according to the present disclosure.

The present disclosure reduces EMI in a system that periodically operates by modulating the time period between ADC signal reading and digital signal processing in software within the Micom through a software delay that is modulated each time, to distribute EMI generation in a particular frequency.

Referring to FIG. 14, the device 10 for reducing EMI according to the present disclosure (hereinafter, the device) includes a read unit 110, a time delay generation unit 130, an algorithm execution unit 150 and transmission unit 170.

The device 10 of the present disclosure is where software (application) for performing the method for reducing EMI is installed and runs, and the read unit 110, the time delay generation unit 130, the algorithm execution unit 150 and the transmission unit 170 may be controlled by the software for performing the method for reducing EMI that runs on the device 10.

The device 10 may be a separate terminal or a constituent module of the terminal. Additionally, the read unit 110, the time delay generation unit 130, the algorithm execution unit 150 and the transmission unit 170 may be formed as an integrated module or may be composed of one or more modules. On the contrary, however, each may be configured as a separate module.

The device 10 may be mobile or stationary. The device 10 may be in the form of a server or an engine, and may be interchangeably used with the terms, a device, an apparatus, a terminal, user equipment (UE), mobile station (MS), a wireless device and a handheld device.

For example, the device 10 may be a micro controller unit (MCU) of a smart car or its constituent module, and besides, may be a module mounted or embedded in automotive, medical, or mobile devices.

The device 10 may execute or create various types of software based on an operation system (OS), i.e., system. The OS is a system program for enabling software to use hardware of a device, and may include mobile computer OS such as Android OS, iOS, Window mobile OS, Bada OS, Symbian OS and Blackberry OS and computer OS such as Windows family, Linux family, Unix family, MAC, AIX and HP-UX.

The read unit 110 reads a digital signal to which an analog signal received from the sensor is converted. The analog signal received from the sensor may be an audio signal, a video signal, a touch signal, a detection signal, an acceleration signal and an optical signal, but is not limited thereto, and may include all signals received from the sensor.

The time delay generation unit 130 generates a time delay that is modulated each cycle of a fixed sampling frequency with software. That is, a time delay that is modulated each cycle with software is added in the time period between when the Micom reads ADC data and starts to compute a digital signal processing algorithm.

Accordingly, although the sampling frequency is fixed, the time of an electric current supplied for digital signal processing algorithm computation is changed as much as the time delay that is modulated each cycle (see FIG. 3). Thus, the EMI frequency is also modulated each cycle with the current change, so the EMI spectrum has a shape that it is spread over many frequencies.

In this instance, the time delay that is modulated each cycle may be obtained by computation using a software algorithm each time, and may be obtained by retrieval of a preset modulation profile stored in the memory.

In an embodiment, the time delay generation unit 130 may select the time delay from the modulation profile pre-stored in the memory in each cycle. The pre-stored modulation profile may be selected sequentially or randomly.

The profile stored in the memory may use sawtooth wave modulation, triangular modulation, Hershey-Kiss modulation and Sigma delta modulation, and the modulation method is not limited thereto and various modulation methods may be applied.

In another embodiment, the time delay generation unit 130 may select the time delay that is modulated by calculating the time delay through computation in each cycle. In this case, different modulation computation functions may be applied each cycle.

The algorithm execution unit 150 starts to execute a digital signal processing algorithm by applying the time delay that is modulated. Accordingly, digital signal processing starts and is executed.

The transmission unit 170 transmits the processed signal to another device such as an actuator or other chip through write of the digital signal when an interrupt occurs in an idle state.

Accordingly, the time of an electric current supplied for digital signal processing algorithm computation is changed as much as the time delay that is modulated each cycle, and as a consequence, the EMI frequency is also modulated each cycle with the current change. Thus, the EMI spectrum is spread, resulting in reduced EMI.

While the present disclosure has been hereinabove with reference to the embodiments, those having ordinary skill in the corresponding technical field will understand that various modifications and changes may be made to the present disclosure without departing from the spirit and scope of the present disclosure in the appended claims.

INDUSTRIAL APPLICABILITY

The present disclosure may reduce EMI resulting from a sampling period by applying SSCG by a software method in the MCU. Accordingly, the present disclosure may be only implemented by software modification without any additional hardware cost, and implementation is very easy. It is expected that the present disclosure will be variously applied in the field with regulations for EMI level at the selling of products such as automotive system ECU or separate sensor systems, medical systems and mobile sensor systems.

The invention claimed is:

1. A method for reducing electromagnetic interference (EMI) in a system that periodically operates with a fixed sampling frequency, the method comprising:
   transmitting, by a sensor, an analog signal;
   converting, by an analog-to-digital converter (ADC), the analog signal received from the sensor to a digital signal;
   reading, by a micro controller not including a Spread Spectrum Clock Generator (SSCG), the digital signal received from the ADC and generating a time delay that is modulated in each cycle of the fixed sampling frequency, by an execution of a software installed in the micro controller, without using a hardware separated from the micro controller for modulating a clock;

processing the digital signal through an execution of a digital signal processing algorithm by applying the modulated time delay; and transmitting the processed digital signal to another device or chip through writing the digital signal.

2. The method of claim 1, wherein the step of the generating of the time delay comprises selecting the time delay for each cycle from a modulation profile which is pre-stored in a memory.

3. The method of claim 2, wherein the modulation profile is selected in a sequential order.

4. The method of claim 2, wherein the modulation profile is randomly selected.

5. The method of claim 1, wherein the step of the generating of the time delay comprises calculating the time delay in each cycle.

6. The method of claim 1, wherein the step of the generating of the time delay comprises applying at least one modulation method of sawtooth wave modulation, triangular modulation, Hershey-Kiss modulation, Sigma delta modulation or random variable generation.

7. A non-transitory computer-readable recording medium having recorded thereon a computer program for performing a method for reducing electromagnetic interference (EMI) in a system that periodically operates with a fixed sampling frequency, the method comprising:

transmitting, by a sensor, an analog signal;

converting, by an analog-to-digital converter (ADC), the analog signal received from the sensor to a digital signal;

reading, by a micro controller not including a Spread Spectrum Clock Generator (SSCG), the digital signal received from the ADC and generating a time delay that is modulated in each cycle of the fixed sampling frequency, by an execution of a software installed in the micro controller, without using a hardware separated from the micro controller for modulating a clock;

processing the digital signal through an execution of a digital signal processing algorithm by applying the modulated time delay; and transmitting the processed digital signal to another device or chip through writing the digital signal.

8. The non-transitory computer-readable recording medium of claim 7, wherein the step of the generating of the time delay comprises selecting the time delay for each cycle from a modulation profile which is pre-stored in a memory.

9. The non-transitory computer-readable recording medium of claim 7, wherein the modulation profile is selected in a sequential order.

10. The non-transitory computer-readable recording medium of claim 7, wherein the modulation profile is randomly selected.

11. The non-transitory computer-readable recording medium of claim 7, wherein the step of the generating of the time delay comprises calculating the time delay in each cycle.

12. The non-transitory computer-readable recording medium of claim 7, wherein the step of the generating of the time delay comprises applying at least one modulation method of sawtooth wave modulation, triangular modulation, Hershey-Kiss modulation, Sigma delta modulation or random variable generation.

13. A device for reducing electromagnetic interference (EMI) in a system that periodically operates with a fixed sampling frequency, comprising:

a sensor configured to transmit an analog signal;

an analog-to-digital converter (ADC) configured to convert the analog signal received from the sensor to a digital signal; and a micro controller including a processor configured to:
read the digital signal received from the ADC and generate a time delay that is modulated in each cycle of the fixed sampling frequency by an execution of a software installed in the processor of the micro controller not including a Spread Spectrum Clock Generator (SSCG), without using a hardware separated from the micro controller for modulating a clock;

process the digital signal through an execution of a digital signal processing algorithm by applying the modulated time delay; and transmit the processed digital signal to another device or chip through writing the digital signal.

14. The device of claim 13, wherein the processor selects the time delay for each cycle from a modulation profile pre-stored in a memory during the generation of the time delay.

15. The device of claim 14, wherein the modulation profile is selected in a sequential or random manner.

16. The device of claim 13, wherein the processor calculates the time delay in each cycle by modulation computation during the generation of the time delay.

17. The device of claim 13, wherein the processor applies at least one modulation method of sawtooth wave modulation, triangular modulation, Hershey-Kiss modulation, Sigma delta modulation or random variable generation during the generation of the time delay.

* * * * *